US009636708B2

(12) United States Patent
Son et al.

(10) Patent No.: US 9,636,708 B2
(45) Date of Patent: May 2, 2017

(54) PIEZOELECTRIC ELEMENT AND ELECTRONIC COMPONENT INCLUDING THE SAME

(71) Applicant: MPLUS CO., LTD., Suwon-si, Gyeonggi-do (KR)

(72) Inventors: Yeon Ho Son, Suwon-si (KR); Joon Choi, Suwon-si (KR); Kyung Su Park, Suwon-si (KR); Jae Kyung Kim, Suwon-si (KR); Seung Hyeon Jeong, Suwon-si (KR); Jun Kun Choi, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/225,602

(22) Filed: Aug. 1, 2016

(65) Prior Publication Data

US 2016/0359098 A1    Dec. 8, 2016

Related U.S. Application Data

(62) Division of application No. 14/280,290, filed on May 16, 2014.

(51) Int. Cl.
*H01L 41/047*    (2006.01)
*H01L 41/083*    (2006.01)
(Continued)

(52) U.S. Cl.
CPC .......... *B06B 1/0603* (2013.01); *B06B 1/0618* (2013.01); *H01L 41/0471* (2013.01);
(Continued)

(58) Field of Classification Search
CPC ....................................................... H04R 17/00
(Continued)

(56) References Cited

U.S. PATENT DOCUMENTS 9,472,746 B2 * 10/2016 Park ...................... B06B 1/0648
9,515,248 B2 * 12/2016 Moon ................. H01L 41/0933
(Continued)

FOREIGN PATENT DOCUMENTS

CN       1304555 A     7/2001
CN       102045037 A   5/2011
JP       2013026809 A  2/2013

OTHER PUBLICATIONS

SIPO Office Action for Chinese Application No. 201410215908.4 which corresponds to the above-referenced U.S. application.
(Continued)

*Primary Examiner* — Thomas Dougherty
(74) *Attorney, Agent, or Firm* — LRK Patent Law Firm

(57) ABSTRACT

A piezoelectric element includes an element layer, an electrode layer including one or more positive electrode layers and one or more negative electrode layers repeatedly stacked to alternate with each other on the element layers in a vertical direction, a primary positive electrode connection member connecting the positive electrode layers, a primary negative electrode connection member connecting the negative electrode layers, at least one secondary positive electrode connection member, at least one secondary negative electrode connection member, and a primary electrode connected to the primary positive electrode connection member and the primary negative electrode connection member and configured of a pair of electrodes, and at least one secondary electrode spaced apart from the primary electrode and configured of a pair of electrodes.

5 Claims, 8 Drawing Sheets

(51) Int. Cl.
*H01L 41/09* (2006.01)
*B06B 1/06* (2006.01)

(52) U.S. Cl.
CPC .......... *H01L 41/0474* (2013.01); *H01L 41/09* (2013.01); *H01L 41/0933* (2013.01)

(58) Field of Classification Search
USPC ............................... 310/328, 330–332, 366
See application file for complete search history.

(56) References Cited

U.S. PATENT DOCUMENTS

| 9,579,691 | B2* | 2/2017 | Son | ........................ | B06B 1/0603 |
| 2009/0213182 | A1* | 8/2009 | Yamanaka | ........... | B41J 2/14274 |
| | | | | | 347/50 |

OTHER PUBLICATIONS

KIPO Office Action for Korean Application No. 10-2013-0137518 which corresponds to the above-referenced U.S. application.

* cited by examiner

PIEZOELECTRIC ELEMENT AND ELECTRONIC COMPONENT INCLUDING THE SAME

CROSS-REFERENCE TO RELATED APPLICATION(S)

This application is a division of U.S. patent application Ser. No. 14/280,290, filed May 16, 2014, which claimed priority to Korean Patent Application Nos. 10-2013-0057436, filed May 21, 2013, and 10-2013-0137518, filed Nov. 13, 2013, the disclosure of which is incorporated in their entireties herein by reference.

BACKGROUND

1. Field of the Invention

The present disclosure relates to a piezoelectric element and an electronic component including the same.

2. Description of Related Art

In various electronic devices such as portable devices, for example, cellular phones, E-book readers, game machines, Portable Media Players (PMP), etc., speakers, actuators, and the like, vibratory function has been utilized for a variety of purposes. In particular, a vibration generator is provided in mobile devices such as cellular phones to be used for silently notifying a user of call reception. In the case of vibration generators, such devices need to be small and multi-functional to keep up with the ever-increasing functionality of portable electronic devices.

Recently, as demand for electronic devices easier to use has increased, touchscreen devices, allowing for user interaction with mobile devices through touch interactions with the screens thereof, to provide an intuitive user interface, have become widespread. A haptic feedback device, disposed in such a touchscreen-equipped device, allows for the diversification of user touch interaction, in addition to the concept of allowing for user interaction with devices through touches made thereto.

Meanwhile, as compared with typical vibration generators using the principle of eccentricity to generate vibrations, vibration generators using piezoelectric elements have relatively fast response times and may be driven at various frequencies.

Further, a multilayer-type piezoelectric element may be used in various electronics. However, in the case that mobile devices receive shocks due to being dropped and have external force applied thereto, reliability of the piezoelectric element may be degraded.

Further, in the case that cracks are formed in a piezoelectric element, an operable region may be reduced, vibratory force may be reduced, and mobile electronic devices may not work properly.

In other words, when cracks are formed in the piezoelectric element, power applied from a circuit board may only be applied to a portion in which cracks are formed, while power may not be applied to a portion in which cracks are not formed. Accordingly, an effective electrode surface may be reduced, and as a result, vibratory force may be reduced.

(Patent Document 1) Korean Patent Laid-Open Publication No. 2008-0090618

SUMMARY

Some embodiments of the present disclosure may provide a piezoelectric element for, for example, but not limited to, preventing an effective power application region from being reduced even in the case in which cracks are generated in the piezoelectric element due to external impacts, and an electronic component including the same.

According to some embodiments of the present disclosure, an electronic component may include a vibration transferring member transferring vibrations, a vibration generation element having both ends mounted on the vibration transferring member, and a piezoelectric element mounted on the vibration generation element and deforming in response to power applied thereto. The piezoelectric element may include a primary electrode configured of a pair of electrodes and at least one or more secondary electrodes configured of a pair of electrodes and spaced apart from the primary electrode.

Even in the case that only one of the primary electrode and the secondary electrode is connected to an external power supply, the piezoelectric element may be deformed.

The piezoelectric element may include an element layer, an electrode layer including one or more positive electrode layers and one or more negative electrode layers repeatedly stacked so as to alternate with each other on the element layers in a vertical direction, a primary positive electrode connection member connecting the positive electrode layers, a primary negative electrode connection member connecting the negative electrode layers, at least one or more secondary positive electrode connection members connecting the positive electrode layers and formed to be spaced apart from the primary positive electrode connection member, and at least one or more secondary negative electrode connection members connecting the negative electrode layers and formed to be spaced apart from the primary negative electrode connection member.

The primary positive electrode connection member, the primary negative electrode connection member, the secondary positive electrode connection member, and the secondary negative electrode connection member may have a via hole provided therein, formed to penetrate through the element layer and the electrode layer.

The electrode layer may be further provided with one or more dummy layers electrically separating the positive electrode layer from the negative electrode layer or electrically separating the negative electrode layer from the positive electrode layer.

The primary positive electrode connection member, the primary negative electrode connection member, the secondary positive electrode connection member, and the secondary negative electrode connection member may be stacked on external surfaces of the element layer and the electrode layer.

The electronic component may further include a circuit board connected to the piezoelectric element.

The circuit board may include a primary circuit board connected to the primary electrode to apply power to the piezoelectric element and at least one secondary circuit board connected to the secondary electrode to apply power to the piezoelectric element.

The circuit board may be provided with a primary connection electrode for electrical connectivity with the piezoelectric element and at least one secondary connection electrode spaced apart from the primary connection electrode by a predetermined interval.

According to some embodiments of the present disclosure, a piezoelectric element may include an element layer, an electrode layer including one or more positive electrode layers and one or more negative electrode layers repeatedly stacked to alternate with each other on the element layers in a vertical direction, a primary positive electrode connection member connecting the positive electrode layers, a primary negative electrode connection member connecting the negative electrode layers, at least one secondary positive electrode connection member connecting the positive electrode layers and formed to be spaced apart from the primary positive electrode connection member, at least one secondary negative electrode connection member connecting the negative electrode layers and formed to be spaced apart from the primary negative electrode connection member, and a primary electrode connected to the primary positive electrode connection member and the primary negative electrode connection member and configured of a pair of electrodes, and at least one secondary electrode spaced apart from the primary electrode and configured of a pair of electrodes connected to the secondary positive electrode connection member and the secondary negative electrode connection member.

Even when only one of the primary electrode and the secondary electrode is connected to an external power supply, the element layer may be deformed.

According to some embodiments of the present disclosure, an electronic component may include a vibration transferring member transferring vibrations, a vibration generation element having both ends mounted on the vibration transferring member, a piezoelectric element mounted on the vibration generation element and deforming in response to power applied thereto, and a circuit board connected to the piezoelectric element. The piezoelectric element may include a primary electrode and one or more secondary electrodes spaced apart from the primary electrode. Even when only one of the primary electrode and the secondary electrode is connected to an external power supply, the piezoelectric element may be deformed.

The primary electrode and the secondary electrode may respectively be configured of a pair of electrodes.

In some embodiments, an electronic component may comprise a piezoelectric element deforming in response to an electric signal, and an elastic member vibrated by deformation of the piezoelectric element. The piezoelectric element may comprise a plurality of electrodes formed to be separated from each other. Each of the electrodes may have independent connection to the piezoelectric element to provide the electric signal.

The piezoelectric element may comprise one or more electrode layers, one or more piezoelectric element layers arranged between the electrode layers, electrode connection members connecting the electrode layers and spaced apart from each other.

The electrode layers may comprise one or more positive electrode layers and one or more negative electrode layers stacked alternatively. The piezoelectric element layer may be arranged between the positive electrode layer and the negative electrode layer.

The electrodes may comprise a primary electrode and one or more secondary electrodes. The primary electrode may comprise a primary positive electrode connection member connecting the positive layers and a primary negative electrode connection member connecting the negative layers. The secondary electrode may comprise a secondary positive electrode connection member connecting the positive layers and a secondary negative electrode connection member connecting negative layers. The primary positive and negative electrode connection members may be arranged to be spaced apart from the secondary positive and negative electrode connection members, respectively.

The piezoelectric element may further comprise a first dummy pattern arranged on the same plane as the positive electrode layer and electrically isolated from the positive electrode layer, and a second dummy pattern arranged on the same plane as the negative electrode layer and electrically isolated from the negative electrode layer.

The electronic component may further comprise a circuit board providing the electrical signal with all of the electrodes.

BRIEF DESCRIPTION OF DRAWINGS

Embodiments of the present disclosure will be more clearly understood from the following detailed description taken in conjunction with the accompanying drawings, in which.

DETAILED DESCRIPTION

Figure 1:
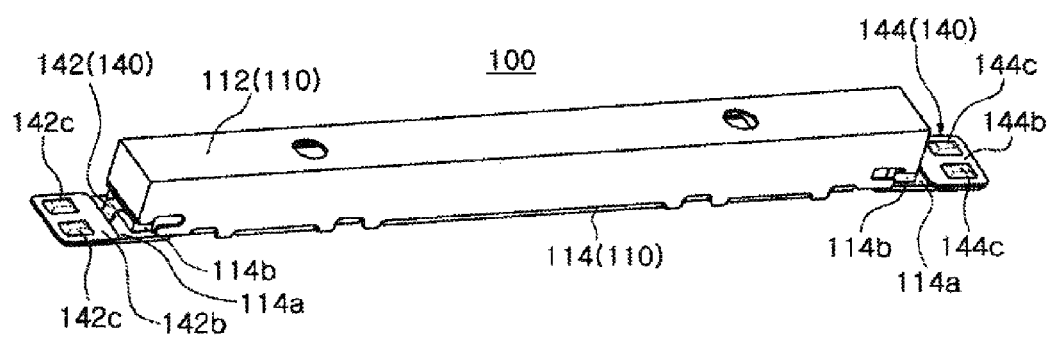
FIG. 1 is a perspective view schematically illustrating an electronic component according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
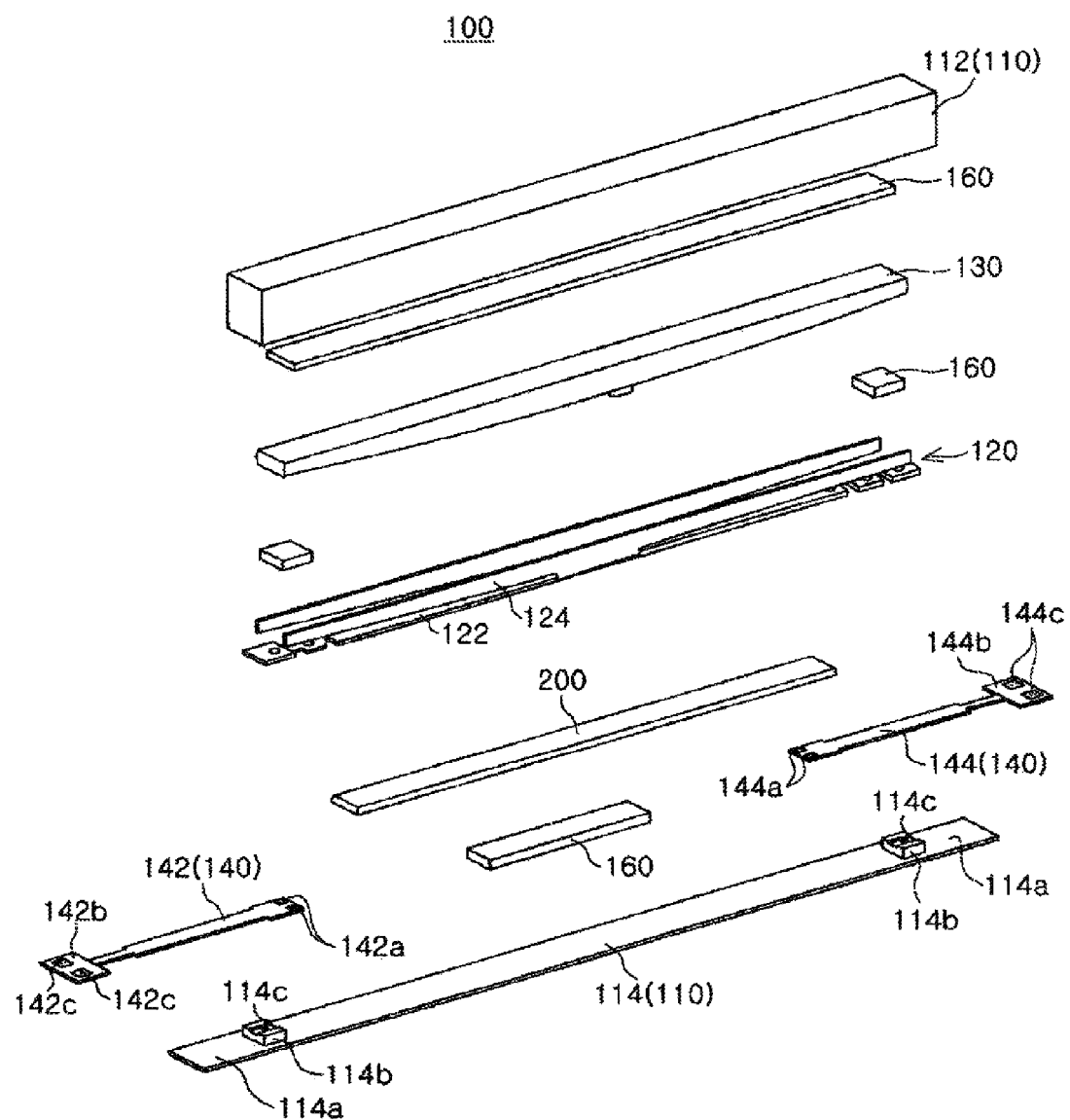
FIG. 2 is an exploded perspective view illustrating the electronic component according to the exemplary embodiment of the present disclosure.

FIG. 1 is a perspective view schematically illustrating an electronic component according to an exemplary embodiment of the present disclosure, and FIG. 2 is an exploded perspective view illustrating the electronic component according to the exemplary embodiment of the present disclosure.

Referring to FIGS. 1 and 2, an electronic component 100 according to an exemplary embodiment of the present disclosure may include, for example, a vibration transferring member 110, an elastic member 120, a mass body 130, a circuit board 140, and a piezoelectric element 200.

The electronic component 100 according to the exemplary embodiment of the present disclosure may be a vibration generator for generating vibrations.

The vibration transferring member 110 may have an internal space and may include one or more seating parts 114a protruding to the exterior of the vibration transferring member 110. Described in more detail, the vibration transferring member 110 may be configured of an upper case 112 and a bracket or lower case 114.

The upper case 112 may have a box shape of which the lower portion is open and may be formed to have an internal space. For example, the upper case 112 may have the box shape or a rectangular parallelepiped shape, and the bracket 114 may be assembled with a lower portion of the upper case 112.

The bracket or lower case 114 may have a plate shape and one or both ends thereof may be provided with support parts 114b for supporting the elastic member 120. Further, one or both ends of the bracket 114 may be provided with the seating parts 114a which extend from the support parts 114b.

Further, the support parts 114b may be provided with insertion grooves 114c into which the circuit board 140 is inserted. Therefore, the circuit board 140 may be exposed to the exterior of the upper case 112.

Both ends of the elastic member 120 may be fixed to the support parts 114b. For example, both ends of the elastic member 120 may be supported by the support parts 114b of the bracket 114.

The elastic member 120 may be configured of a plate part 122 having a plate shape and an extending part 124 extended from both sides of the plate part 122.

One or both ends of the plate part 122 may be supported by the support parts 114b. When power is applied to the piezoelectric element 200, the plate part 122 vibrates in a vertical manner due to the deformation of the piezoelectric element 200.

The extending part 124 is configured to support both sides of the mass body 130 and may have a shape corresponding to a shape of the mass body 130.

However, the shape of the extending part 124 may be changed.

Both sides of the mass body 130 may be supported by the extending part 124 of the elastic member 120. For example, both sides of the mass body 130 are supported by the extending part 124, and thus, when the elastic member 120 vibrates, the mass body 130 may vibrate along with the elastic member 120.

The mass body 130 serves to amplify the vibrations of the elastic member 120 and may be formed of, for example, a tungsten material.

The mass body 130 may have a shape corresponding to the shape of the extending part 124 and thus the mass body 130 may be more stably supported by the extending part 124.

The circuit board 140 is disposed to be extended from the interior of the vibration transferring member 110 to the exterior thereof and may be exposed outside of the vibration transferring member 110. One end of the circuit board 140 is connected to the piezoelectric element 200, and the other end thereof may be fixed to the seating part 114a of the bracket 114.

The circuit board 140 may include a primary circuit board 142 and at least one secondary circuit board 144. The primary circuit board 142 may be exposed outside of one end of the vibration transferring member 110, and the secondary circuit board 144 may be exposed outside of the other end of the vibration transferring member 110.

Further, the primary circuit board 142 and the secondary circuit board 144 may be mounted to different positions, and may include the same components.

One end of the primary circuit board 142 may be provided with a connection electrode 142a for electrical connection with the piezoelectric element 200, and the other end of the primary circuit board 142 may be provided with an electrode connection part 142b fixed to the seating part 114a of the bracket 114.

Further, the electrode connection part 142b may be provided with an external connection electrode 142c for connection with an external power supply.

One end of the secondary circuit board 144 may also be provided with a connection electrode 144a for electrical connection with the piezoelectric element 200, and the other end of the secondary circuit board 144 may be provided with an electrode connection part 144b fixed to the seating part 114a of the bracket 114.

Further, the electrode connection part 144b of the secondary circuit board 144 may be provided with an external connection electrode 144c for connection with the external power supply.

The piezoelectric element 200 may have, for example, a rectangular parallelepiped shape, and may be fixed or coupled to the elastic member 120. In other words, the piezoelectric element 200 is fixed to at least one of a bottom surface or a top surface of the plate part 122 of the elastic member 120. When power is applied to the piezoelectric element 200, the piezoelectric element 200 is deformed in a length direction and serves to vibrate the elastic member 120.

The piezoelectric element 200 will be described in more detail with reference to FIGS. 3 and 4.

Further, the vibration generator 100 according to the exemplary embodiment of the present disclosure may include a plurality of damper members 160. The damper members 160 may serve to prevent collisions between the mass body 130, the elastic member 120, and the vibration transferring member 110 at the time of vibrations. However, the damper member may not be included in the vibration generator 100.

Figure 3:
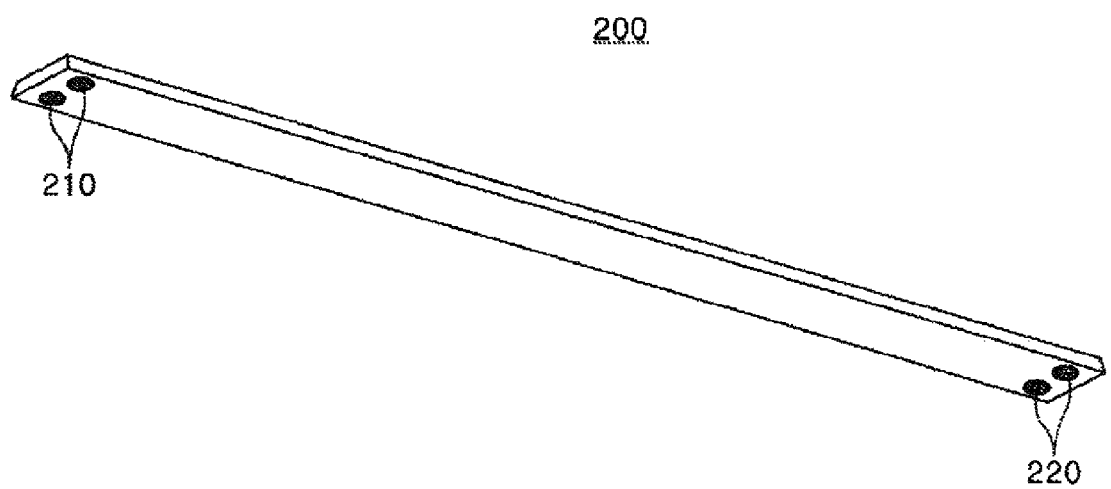
FIG. 3 is a bottom perspective view illustrating a piezoelectric element according to an exemplary embodiment of the present disclosure.
Figure 4:
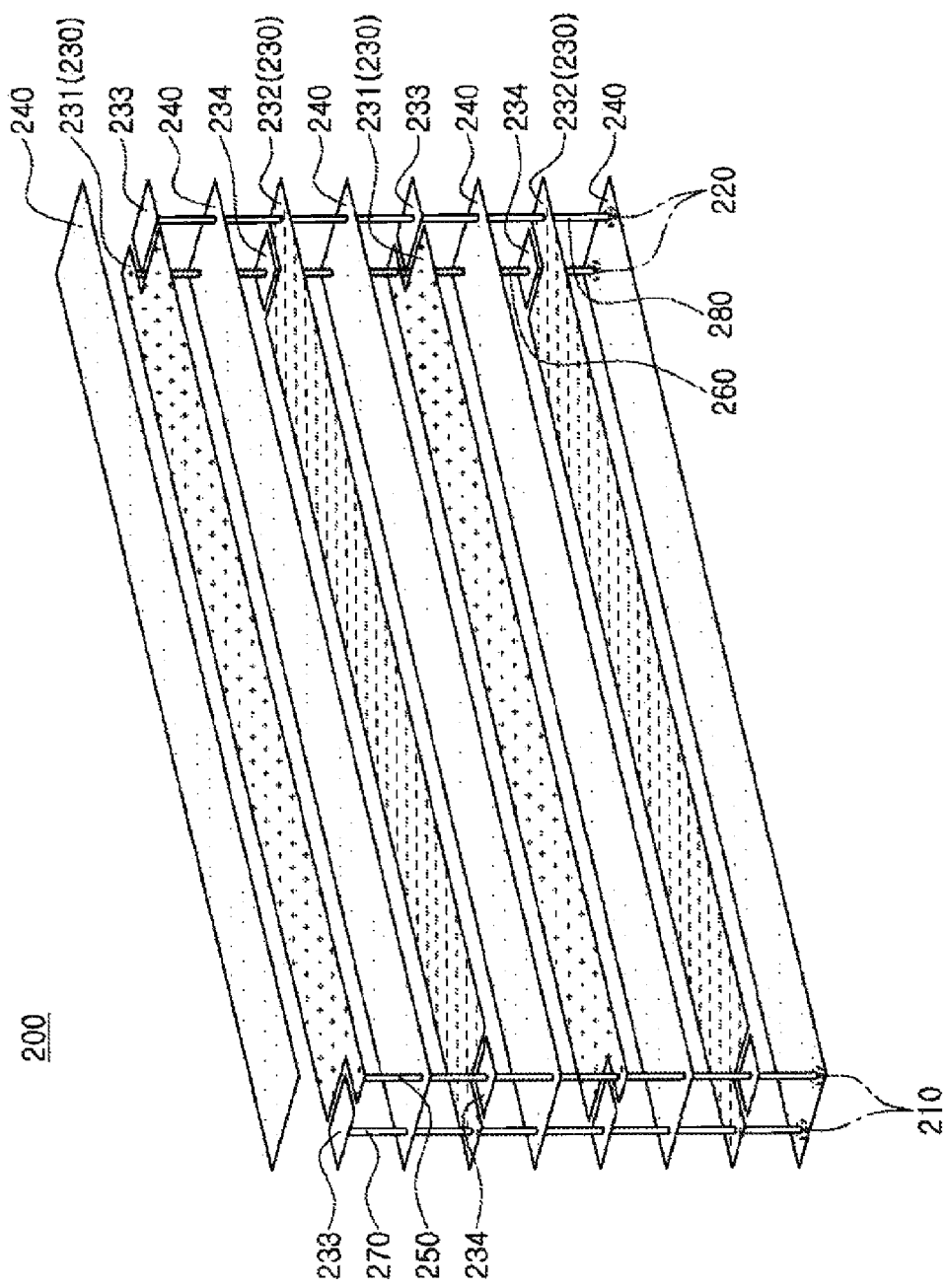
FIG. 4 is an exploded perspective view schematically illustrating the piezoelectric element according to the exemplary embodiment of the present disclosure.

FIG. 3 is a bottom perspective view illustrating the piezoelectric element according to an exemplary embodiment of the present disclosure, and FIG. 4 is an exploded perspective view schematically illustrating the piezoelectric element according to the exemplary embodiment of the present disclosure.

Referring to FIGS. 3 and 4, a piezoelectric element 200 according to an exemplary embodiment of the present disclosure may include, for example, a primary electrode 210 and at least one or more secondary electrodes 220.

As illustrated in FIG. 4, the piezoelectric element 200 may include an electrode layer 230 including one or more positive electrode layers 231 and one or more negative electrode layers 232 repeatedly stacked so as to alternate with each other in a vertical direction, and an element layer 240 interposed between the positive electrode layer 231 and the negative electrode layer 232.

The piezoelectric element 200 may include a primary positive electrode connection member 250 connecting one end of the positive electrode layers 231, a secondary positive electrode connection member 260 connecting the other end of the positive electrode layers 231, a primary negative electrode connection member 270 connecting one end of the negative electrode layers 232, and a secondary negative electrode connection member 280 connecting the other end of the negative electrode layers 232.

Meanwhile, the primary electrode 210 may be connected to the primary positive electrode connection member 250 and the primary negative electrode connection member 270, and the secondary electrode 220 may be connected to the secondary positive electrode connection member 260 and the secondary negative electrode connection member 280.

Further, the primary positive electrode connection member 250, the secondary positive electrode connection member 260, the primary negative electrode connection member 270, and the secondary negative electrode connection member 280 may be provided with via holes.

The positive electrode layer 231, the negative electrode layer 232, the primary positive electrode connection member 250, the secondary positive electrode connection member 260, the primary negative electrode connection member 270, and the secondary negative electrode connection member 280 may be formed of, for example, but not limited to, a conductive metal material. However, any material having conductivity may be used. The element layer 240 may be formed of a piezoelectric material, for example, a lead zirconate titanate (PZT) ceramic material.

Further, one or both ends of the positive electrode layer 231 may be provided with one or more negative dummy patterns or layers 233 separated from the positive electrode layers 231 and/or arranged on the same plane. One or both ends of the negative electrode layer 232 may be provided with one or more positive dummy patterns or layers 234 separated from the negative electrode layers 232 and/or arranged on the same plane.

For example, both ends of the positive electrode layer 231 may be provided with the negative dummy patterns 233 through which the primary negative electrode connection member 270 and the secondary negative electrode connection member 280 connecting the negative electrode layers 232 pass. Additionally, both ends of the negative electrode layer 232 may be provided with the positive dummy patterns 234 through which the primary positive electrode connection member 250 and the secondary positive electrode connection member 260 connecting the positive electrode layers 231 pass.

Both ends of the positive electrode layer 231 may be connected by the primary positive electrode connection member 250 and the secondary positive electrode connection member 260, and both ends of the negative electrode layer 232 may be connected by the primary negative electrode connection member 270 and the secondary negative electrode connection member 280.

Therefore, even when cracks are formed in a central or any other portion of the piezoelectric element due to external shocks, power may be applied to the piezoelectric element 200 through the primary electrode 210 and the secondary electrode 220.

In other words, power is applied to the positive electrode layer 231 and the negative electrode layer 232 through the primary positive electrode connection member 250 and the primary negative electrode connection member 270, and at the same time, power may be applied to the positive electrode layer 231 and the negative electrode layer 232 through the secondary positive electrode connection member 260 and the secondary negative electrode connection member 280.

In some embodiments, even in the case that cracks are formed in the central or any other portion of the piezoelectric element 200 due to the application of external shocks, a signal may be applied to both sides of the piezoelectric element 200 as in the case before cracks are formed, and thus loss of an effective electrode surface may be prevented.

For example, the positive electrode layer 231 and the negative electrode layer 232 are connected by not only the primary positive electrode connection member 250 and the primary negative electrode connection member 270 but also the secondary positive electrode connection member 260 and the secondary negative electrode connection member 280. Therefore, even in the case in which cracks are formed in the piezoelectric element 200 due to the external shocks, loss of the effective electrode surface may be suppressed.

Meanwhile, the exemplary embodiment of the present disclosure describes, by way of example, the case in which the piezoelectric element 200 has only one secondary electrode 220, but is not limited thereto. The piezoelectric element 200 may include two or more secondary electrodes 220. In this case, the number of circuit boards 140 may also be changed depending on the number of secondary electrodes 220 included in the piezoelectric element 200.

Further, the exemplary embodiment of the present disclosure describes, by way of example, the case in which the piezoelectric element 200 is provided in the vibration generator 100, but is not limited thereto. The piezoelectric element 200 may be adopted in various electronic components such as a speaker, an actuator, or the like.

For example, in some embodiments, the primary electrode 210 and at least one or more secondary electrodes 220 are provided in the piezoelectric element 200. Therefore, even in the case in which cracks are formed in the piezoelectric element 200 on external impact, power can be applied through the secondary electrode 220, and thus the degradation in performance of the electronic component 100 may be suppressed.

Hereinafter, an electronic component according to another exemplary embodiment of the present disclosure will be described with reference to the accompanying drawings. However, throughout the drawings, the same or similar components as the foregoing components are denoted by the same reference numerals, and the detailed description thereof is replaced with the foregoing description and will be omitted hereinafter.

Figure 5:
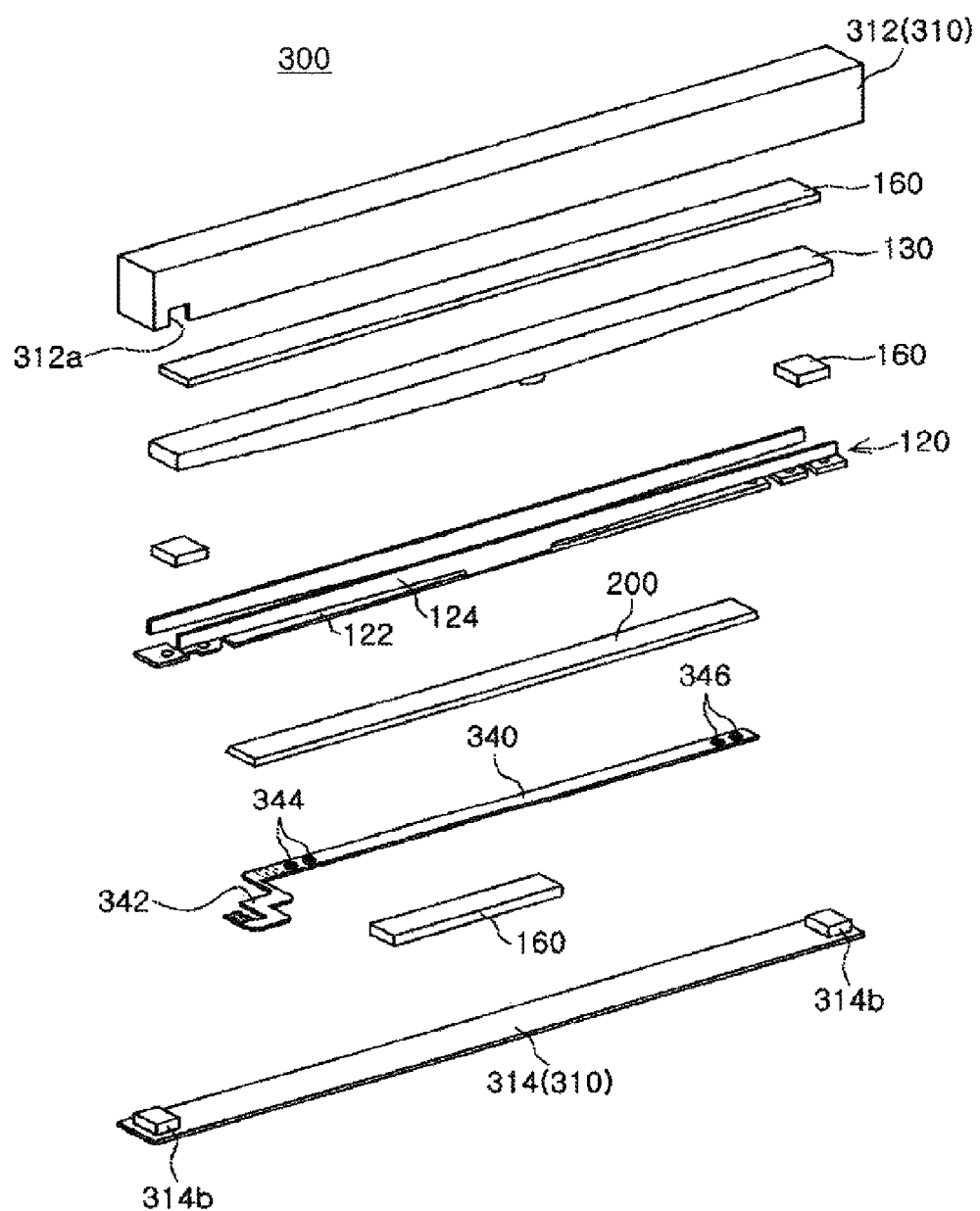
FIG. 5 is an exploded perspective view illustrating an electronic component according to another exemplary embodiment of the present disclosure.
Figure 6:
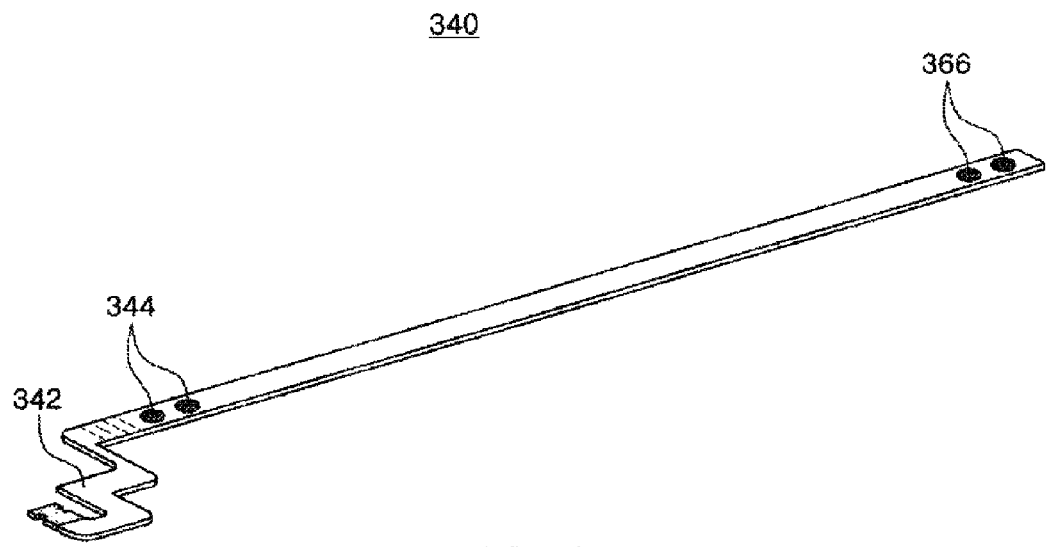
FIG. 6 is a perspective view illustrating a circuit board included in the electronic component according to another exemplary embodiment of the present disclosure.

FIG. 5 is an exploded perspective view illustrating an electronic component according to another exemplary embodiment of the present disclosure, and FIG. 6 is a perspective view illustrating a circuit board included in the electronic component according to another exemplary embodiment of the present disclosure.

Referring to FIGS. 5 and 6, an electronic component 300 according to another exemplary embodiment of the present disclosure may include a vibration transferring member 310, the elastic member 120, the mass body 130, and the circuit board 340, the piezoelectric element 200.

The electronic component 300 according to another exemplary embodiment of the present disclosure may be a vibration generator for generating vibrations.

Further, the elastic member 120, the mass body 130, and the piezoelectric element 200 are the same as, or similar with, the components of the foregoing exemplary embodiment of the present disclosure, and therefore the detailed description thereof is replaced with the foregoing description and will be omitted hereinafter.

The vibration transferring member 310 has an internal space. To this end, the vibration transferring member 310 may be configured of an upper case 312 and a bracket or lower case 314.

The upper case 312 may have a box shape of which the lower portion is open and may be formed to have an internal space. One side of the upper case 312 may be provided with a withdrawal groove 312a through which a circuit board 340 may be exposed.

Further, the bracket 314 may be assembled with a lower portion of the upper case 312.

The bracket 314 may have a plate shape and one or both ends thereof may be provided with one or more support parts 3141) for supporting the elastic member 120.

The circuit board 340 is disposed to be extended from the interior of the vibration transferring member 310 to the exterior thereof, and exposed outside of the vibration transferring member 310. One end of the circuit board 340 may be connected to the piezoelectric element 200, and the other end thereof is exposed to the exterior of the vibration transferring member 310. For example, the other end of the circuit board 340 may be provided with a lead-out portion 342 exposed to the exterior of the vibration transferring member 310. The lead-out portion 342 may be provided with an external connection electrode (not shown) for a connection to the external power supply.

The circuit board 340 may be provided with one or more primary connection electrodes 344 and one or more secondary connection electrodes 346 for electrical connection with the piezoelectric element 200.

Therefore, power may be applied to the primary electrode 210 and the secondary electrode 220 of the piezoelectric element 200 through the single circuit board 340.

Hereinafter, a piezoelectric element according to another exemplary embodiment of the present disclosure will be described with reference to FIG. 7.

Figure 7:
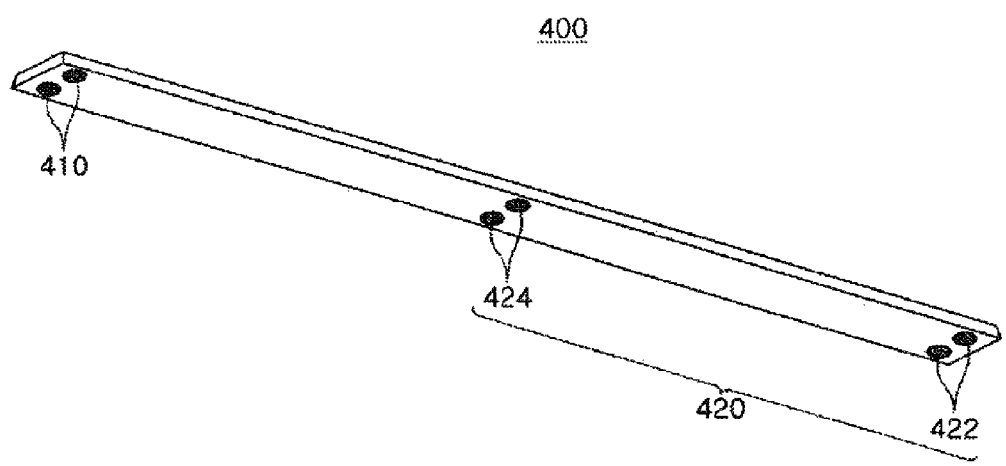
FIG. 7 is a bottom perspective view illustrating a piezoelectric element according to another exemplary embodiment of the present disclosure.

FIG. 7 is a bottom perspective view illustrating a piezoelectric element according to another exemplary embodiment of the present disclosure.

Referring to FIG. 7, a piezoelectric element 400 according to another exemplary embodiment of the present disclosure may include, for example, a primary electrode 410 and a secondary electrode part 420. The secondary electrode part 420 may include first and second secondary electrodes 422 and 424.

The primary electrode 410 may be disposed at one end of the piezoelectric element 400, and the first secondary electrode 422 may be disposed at the other end of the piezoelectric element 400. The second secondary electrode 424 may be disposed between the primary electrode 410 and the first secondary electrode 422.

The exemplary embodiment of the present disclosure describes, by way of example, the case in which the second secondary electrode 424 is disposed in a central portion of the piezoelectric element 400, but is not limited thereto. The second secondary electrode 424 may be disposed in any portion of the piezoelectric element 400, for example, in the portion adjacent to the primary electrode 410 or the first secondary electrode 422.

Further, the exemplary embodiment of the present disclosure describes, by way of example, the case in which the secondary electrode part 420 includes the first and second secondary electrodes 422 and 424, but is not limited thereto. The secondary electrode part 420 may include three or more secondary electrodes.

Hereinafter, a piezoelectric element according to another exemplary embodiment of the present disclosure will be described with reference to FIG. 8.

Figure 8:
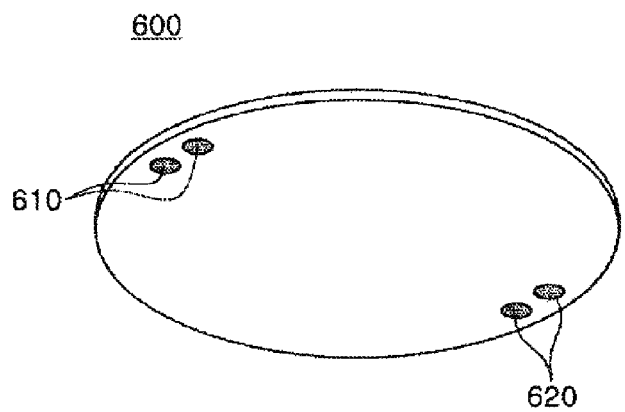
FIG. 8 is a bottom perspective view illustrating a piezoelectric element according to another exemplary embodiment of the present disclosure.

FIG. 8 is a bottom perspective view illustrating a piezoelectric element according to another exemplary embodiment of the present disclosure.

Referring to FIG. 8, a piezoelectric element 600 according to another exemplary embodiment of the present disclosure may include, for example, a primary electrode 610 and a secondary electrode 620.

The piezoelectric element 600 may have a circular coin shape. The primary electrode 610 and the secondary electrode 620 may be disposed on, for example, but not limited to, a bottom surface of the piezoelectric element 600. The primary electrode 610 and the secondary electrode 620 may be disposed on a side or/and a top surface of the piezoelectric element 600.

For example, the primary electrode 610 and the secondary electrode 620 may be disposed on at least one of the top surface, the bottom surface, or the side of the piezoelectric element 600.

Further, the exemplary embodiment of the present disclosure describes, by way of example, the case in which the piezoelectric element 600 has a circular coin shape but is not limited thereto. The piezoelectric element 600 may have various shapes. For example, the piezoelectric element 600 may have an oval shape when viewed from above, as well as various other shapes such as a pentagon and a hexagon.

Hereinafter, a piezoelectric element according to another exemplary embodiment of the present disclosure will be described with reference to FIGS. 9 and 10.

Figure 9:
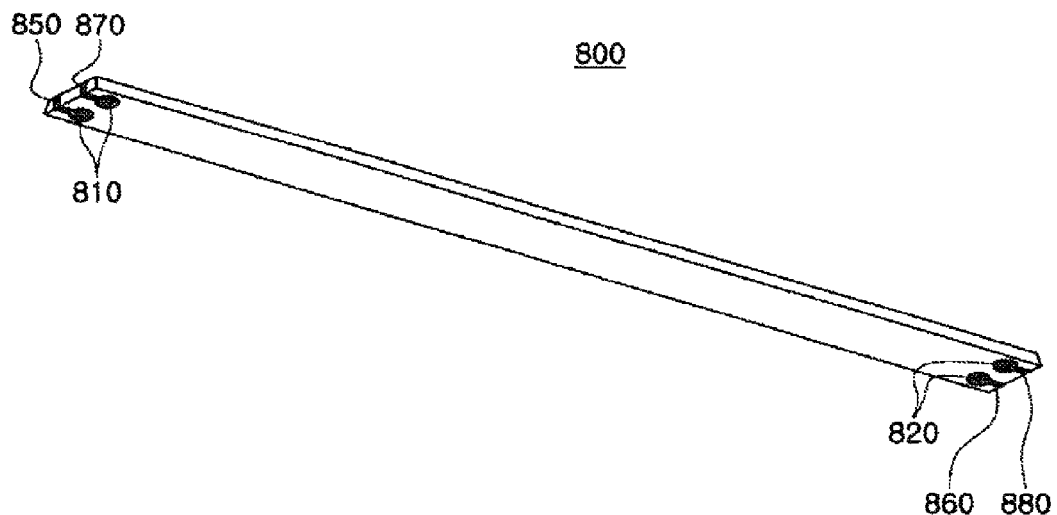
FIG. 9 is a bottom perspective view illustrating a piezoelectric element according to another exemplary embodiment of the present disclosure.
Figure 10:
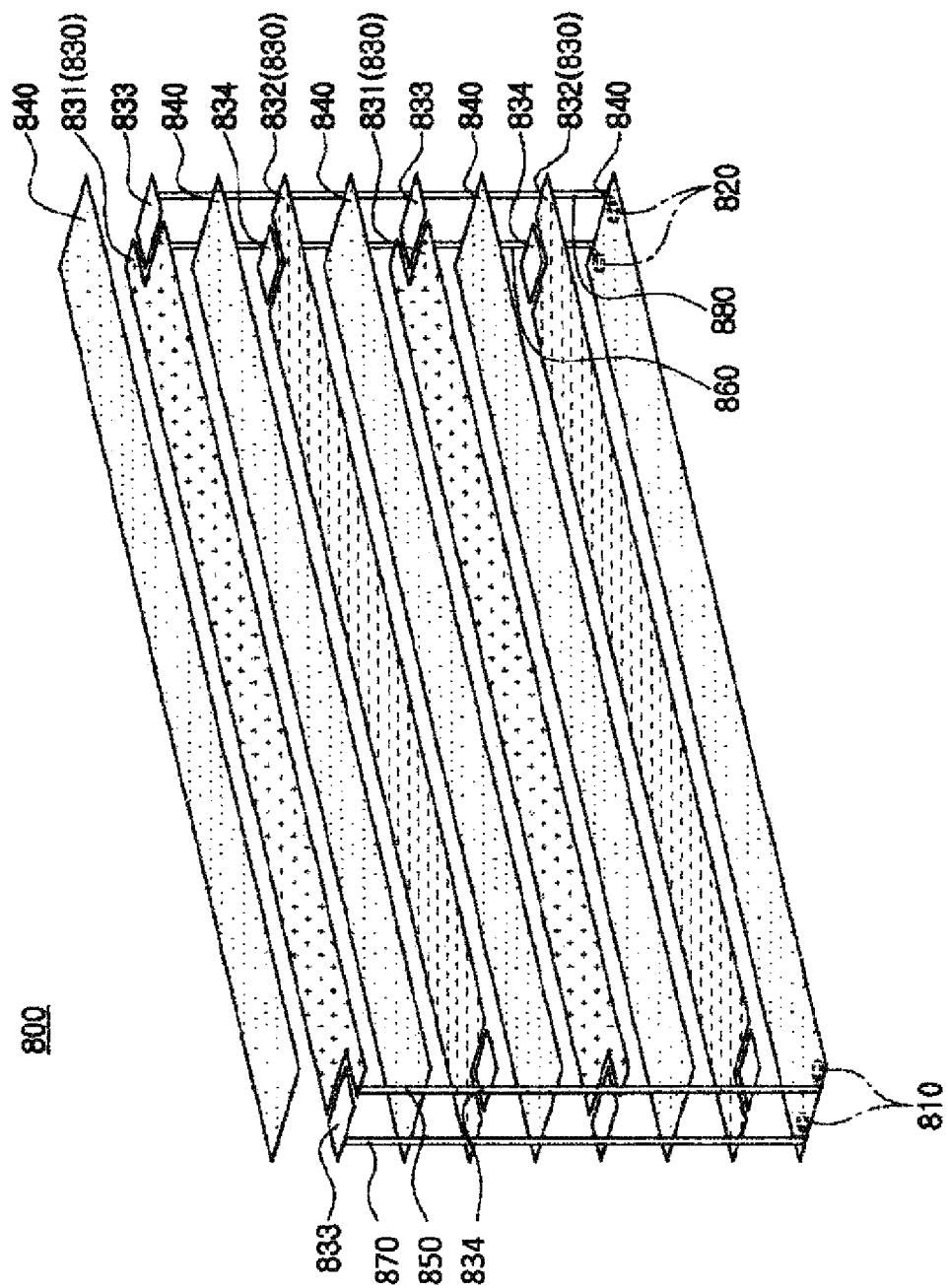
FIG. 10 is an exploded perspective view schematically illustrating the piezoelectric element according to the exemplary embodiment of the present disclosure.

FIG. 9 is a bottom perspective view illustrating the piezoelectric element according to another exemplary embodiment of the present disclosure and FIG. 10 is an exploded perspective view schematically illustrating the piezoelectric element according to the exemplary embodiment of the present disclosure.

Referring to FIGS. 9 and 10, a piezoelectric element 800 according to another exemplary embodiment of the present disclosure may include, for example, one or more primary electrodes 810 and at least one or more secondary electrodes 820.

As illustrated in FIG. 10, the piezoelectric element 800 may include electrode layers 830 including one or more positive electrode layers 831 and one or more negative electrode layers 832 repeatedly stacked so as to alternate with each other in a vertical direction, and one or more element layers 840 interposed between the positive electrode layer 831 and the negative electrode layer 832.

Further, the piezoelectric element 800 may include a primary positive electrode connection member 850 connecting one end of the positive electrode layers 831, a secondary positive electrode connection member 860 connecting the other end of the positive electrode layers 831, a primary negative electrode connection member 870 connecting one end of the negative electrode layers 832, and a secondary negative electrode connection member 880 connecting the other end of the negative electrode layers 832.

The primary positive electrode connection member 850 and the primary negative electrode connection member 870 may be connected to the primary electrode 810, and the secondary positive electrode connection member 860 and the secondary negative electrode connection member 880 may be connected to the secondary electrode 820.

Further, the primary positive electrode connection member 850, the secondary positive electrode connection member 860, the primary negative electrode connection member 870, and the secondary negative electrode connection member 880 may be stacked and/or formed on external surfaces of the electrode layers 830 and the element layers 840.

The positive electrode layer 831, the negative electrode layer 832, the primary positive electrode connection member 850, the secondary positive electrode connection member 860, the primary negative electrode connection member 870, and the secondary negative electrode connection member 880 may be formed of, for example, but not limited to, a conductive metal. However, any material having conductivity may be used. The element layer 840 may be formed of a piezoelectric material, for example, a lead zirconate titanate (PZT) ceramic material.

Further, one or both ends of the positive electrode layer 831 may be further provided with negative dummy patterns 833 separated from the positive electrode layer 831 and/or arranged on the same plane, and one or both ends of the negative electrode layer 832 may be provided with positive dummy patterns 834 separated from the negative electrode layer 832 and/or arranged on the same plane.

For example, both ends of the positive electrode layer 831 may be provided with the negative dummy pattern 833 which contact the primary negative electrode connection member 870 and the secondary negative electrode connection member 880 connecting the negative electrode layers 832. Further, both ends of the negative electrode layer 832 may be provided with the positive dummy patterns 834 which contact the primary positive electrode connection member 850 and the secondary positive electrode connection member 860 connecting the positive electrode layers 831.

According to some embodiments of the present disclosure, even in the case that cracks are formed in the piezoelectric elements 200, 400, 600 and 800 due to the external shocks, the reduction in deformation of the piezoelectric elements 200, 400, 600 and 800 may be suppressed by the secondary electrodes 220, 420, 620 and 820.

In other words, power may be additionally applied to the positive electrode layer 231 and 831 and the negative electrode layer 232 and 832 through the secondary positive electrode connection member 260 and 860 and the secondary negative electrode connection member 280 and 880, such that even in the case that cracks are formed in the piezoelectric elements 200, 400, 600 and 800 due to external shocks, the reduction in the effective power applying region may be suppressed.

While exemplary embodiments have been shown and described above, it will be apparent to those skilled in the art that modifications and variations could be made without departing from the spirit and scope of the present disclosure as defined by the appended claims.

What is claimed is:

1. A piezoelectric element comprising:
an electrode layer including positive electrode layers and negative electrode layers, which are repeatedly stacked to alternate with each other;
one or more element layers arranged between each of the positive electrode layers and each of the negative electrode layers;
a primary positive electrode connection member connecting the positive electrode layers;
a primary negative electrode connection member connecting the negative electrode layers;
at least one secondary positive electrode connection member connecting the positive electrode layers and formed to be spaced apart from the primary positive electrode connection member;
at least one secondary negative electrode connection member connecting the negative electrode layers and formed to be spaced apart from the primary negative electrode connection member;
a primary electrode connected to the primary positive electrode connection member and the primary negative electrode connection member and configured of a plurality of electrodes; and
at least one secondary electrode spaced apart from the primary electrode and configured of a plurality of electrodes connected to the secondary positive electrode connection member and the secondary negative electrode connection member.

2. The piezoelectric element of claim 1, wherein the one or more element layers are deformed by connecting at least one of the primary electrode and the secondary electrode to an external power supply.

3. The piezoelectric element of claim 1, wherein the primary positive electrode connection member, the primary negative electrode connection member, the secondary positive electrode connection member, and the secondary negative electrode connection member have via holes which are provided therein and formed to penetrate through the one or more element layers and the electrode layer.

4. The piezoelectric element of claim 3, wherein the electrode layer is further provided with one or more dummy layers to electrically separate the positive electrode layers from the negative electrode layers or to electrically separate the negative electrode layers from the positive electrode layers.

5. The piezoelectric element of claim 1, wherein the primary positive electrode connection member, the primary negative electrode connection member, the secondary positive electrode connection member, and the secondary negative electrode connection member are stacked on external surfaces of the one or more element layers and the electrode layer.

* * * * *